(12) United States Patent
Corsi et al.

(10) Patent No.: US 8,941,414 B2
(45) Date of Patent: *Jan. 27, 2015

(54) TRACK-AND-HOLD CIRCUIT WITH LOW DISTORTION

(71) Applicant: Texas Instruments Incorporated, Dallas, TX (US)

(72) Inventors: Marco Corsi, Parker, TX (US); Robert F. Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

This patent is subject to a terminal disclaimer.

(21) Appl. No.: 13/654,575

(22) Filed: Oct. 18, 2012

(65) Prior Publication Data

US 2013/0038480 A1 Feb. 14, 2013

Related U.S. Application Data

(60) Division of application No. 12/862,455, filed on Aug. 24, 2010, now Pat. No. 8,305,114, and a division of application No. 12/393,164, filed on Feb. 26, 2009, now Pat. No. 7,804,336, and a continuation-in-part of application No. 11/876,943, filed on Oct. 23, 2007, now Pat. No. 7,782,096.

(51) Int. Cl.
| | |
|---|---|
| H03K 5/00 | (2006.01) |
| G11C 27/02 | (2006.01) |
| H03M 1/06 | (2006.01) |
| H03M 1/12 | (2006.01) |

(52) U.S. Cl.
CPC ........... *G11C 27/026* (2013.01); *H03M 1/0624* (2013.01); *H03M 1/1245* (2013.01)
USPC .............................................. 327/91; 327/94

(58) Field of Classification Search
USPC ................................................ 327/91, 94–96
See application file for complete search history.

(56) References Cited

U.S. PATENT DOCUMENTS

| | | | |
|---|---|---|---|
| 5,467,035 A | 11/1995 | Ohi et al. | |
| 6,489,814 B2 | 12/2002 | Hoogzad et al. | |
| 6,741,105 B2 | 5/2004 | Yasukouchi et al. | |
| 6,943,593 B2 | 9/2005 | Draxelmayr | |
| 7,057,450 B2 | 6/2006 | Koike | |
| 7,088,148 B2 | 8/2006 | Devendorf et al. | |
| 7,782,096 B2 | 8/2010 | Corsi et al. | |
| 7,804,336 B2 | 9/2010 | Corsi et al. | |
| 8,305,114 B2 * | 11/2012 | Corsi et al. ...................... | 327/91 |

* cited by examiner

*Primary Examiner* — Hai L Nguyen
(74) *Attorney, Agent, or Firm* — Alan A. R. Cooper; Frederick J. Telecky, Jr.

(57) ABSTRACT

A track-and-hold circuit is provided. This track-and-hold circuit is adapted to track an analog input signal and hold a sampled voltage of the analog input signal at a sampling instant for processing by other circuitry, in response to a track signal that alternates with a hold signal. Preferably, the track-and-hold circuit includes a bi-directional current source that sources and sinks current through a first output node and a second output node, a unity gain amplifier that is coupled to first and second output nodes of the bi-directional current source and that receives the analog input signal, a resistor coupled to an output of the unity gain amplifier, and a capacitor coupled between the resistor and ground. Of interest, however, is the bi-directional current source, which includes a differential input circuit that is adapted to receive the track signal and the hold signal and that is coupled to the first and second output nodes and an RC network that is coupled to the differential input circuit. The RC network receives the analog input signal and is scaled to change the location of a zero to reduce the signal-dependence of the sampling instant.

6 Claims, 11 Drawing Sheets

TRACK-AND-HOLD CIRCUIT WITH LOW DISTORTION

CROSS-REFERENCE TO RELATED APPLICATIONS

This application is a continuation of U.S. patent application Ser. No. 12/862,455, entitled "Track-and-Hold Circuit with Low Distortion," filed on Aug. 24, 2010, which is now U.S. Pat. No. 8,305,114, which issued on Nov. 6, 2012, which is a continuation of U.S. patent application Ser. No. 12/393,164, entitled "Track-and-Hold Circuit with Low Distortion," filed Feb. 26, 2009 (now U.S. Pat. No. 7,804,336, issued Sep. 28, 2010), which is a continuation-in-part of U.S. patent application Ser. No. 11/876,943, entitled "Track-and-Hold Circuit with Low Distortion," filed Oct. 23, 2007 (now U.S. Pat. No. 7,782,096, issued Aug. 24, 2010). Each of these applications is incorporated herein by reference for all purposes.

TECHNICAL FIELD

The present invention relates to track and hold circuits, and more particularly relates to a method and/or apparatus for improving the performance of such circuits.

BACKGROUND

High-speed, low-power analog-to-digital converters (ADCs) are widely used in numerous applications, for example in portable wireless communications devices. The general architecture of a typical ADC is shown in FIG. 3. An analog input signal $I_A$ is provided to a track-and-hold (or, sample-and-hold) circuit that receives $I_A$ and samples the voltage of that signal at regular intervals. These sample voltages are each held for a period, and provided serially to form an output signal $I_S$ that is provided as an output of the track-and-hold circuit and as an input to the following stage, a quantizer. The quantizer converts the values of the voltage levels of $I_S$ to a digital signal, that it outputs as $O_D$.

The requirement for ever improved performance in the commercial world of technology results in a corresponding demand for ever improved performance of ADCs. Generally, the performance of high-speed ADC is limited by the performance of its track-and-hold circuit. U.S. Pat. No. 6,489,814, which issued on Dec. 3, 2002, to Gian Hoogzaad et al., discloses an exemplary prior art track-and-hold circuit that attempts to reduce excess currents flowing onto the hold capacitor using a feedback connection. However, prior art track-and-hold circuits still suffer from problems such as harmonic distortion, that adversely affects performance of the ADC.

There is thus a need for a way of improving the performance of ADC track-and-hold circuits.

SUMMARY

A preferred embodiment of the present invention, accordingly, provides a track-and-hold circuit that is adapted to track an analog input signal and hold a sampled voltage of the analog input signal at a sampling instant for processing by other circuitry, in response to a track signal that alternates with a hold signal. The track-and-hold circuit comprises a bi-directional current source that sources and sinks current through a first output node and a second output node, wherein the bi-directional current source includes a differential input circuit that is adapted to receive the track signal and the hold signal and that is coupled to the first and second output nodes; an RC network that is coupled to the differential input circuit, wherein the RC network receives the analog input signal and is scaled to change the location of a zero to reduce the signal-dependence of the sampling instant; a unity gain amplifier that is coupled to first and second output nodes of the bi-directional current source and that receives the analog input signal; a resistor coupled to an output of the unity gain amplifier; and a capacitor coupled between the resistor and ground.

In accordance with a preferred embodiment of the present invention, the RC network further comprises a second resistor and a second capacitor coupled in series with one another.

In accordance with a preferred embodiment of the present invention, the second resistor and the second capacitor are about equal to resistor and capacitor, respectively.

In accordance with a preferred embodiment of the present invention, the bi-directional current source further comprises a second differential input circuit that is adapted to receive the track signal and the hold signal and that is coupled to the first and second output nodes.

In accordance with a preferred embodiment of the present invention, the bi-directional current source further comprises a second RC network that is coupled to the second differential input circuit, wherein the second RC network receives the analog input signal and is scaled to change the location of a zero to reduce the signal-dependence of the sampling instant.

In accordance with a preferred embodiment of the present invention, the RC network further comprises a second resistor and a second capacitor coupled in series with one another and wherein the second RC network further comprises a third resistor and a third capacitor coupled in series with one another.

In accordance with a preferred embodiment of the present invention, the combined resistance of second and third resistors and the combined capacitances of the second and third capacitors are about equal to resistance of the resistor and the capacitance of the capacitor, respectively.

In accordance with a preferred embodiment of the present invention, the track-and-hold circuit further comprises a unity gain buffer that is coupled to the resistor and the capacitor.

In accordance with a preferred embodiment of the present invention, an analog-to-digital converter (ADC) is provided. The ADC comprises a track-and-hold circuit that is adapted to track an analog input signal and hold a sampled voltage of the analog input signal at a sampling instant for processing by other circuitry, in response to a track signal that alternates with a hold signal, wherein the track-and-hold circuit includes: a bi-directional current source that sources and sinks current through a first output node and a second output node, wherein the bi-directional current source includes: a differential input circuit that is adapted to receive the track signal and the hold signal and that is coupled to the first and second output nodes; an RC network that is coupled to the differential input circuit, wherein the RC network receives the analog input signal and is scaled to change the location of a zero to reduce the signal-dependence of the sampling instant; a unity gain amplifier that is coupled to first and second output nodes of the bi-directional current source and that receives the analog input signal; a resistor coupled to an output of the unity gain amplifier; and a capacitor coupled between the resistor and ground; and a quantizer adapted to convert the values of the sampled voltage to a digital signal.

In accordance with a preferred embodiment of the present invention, an ADC is provided. The ADC comprises a track-and-hold circuit that is adapted to track an analog input signal and hold a sampled voltage of the analog input signal at a sampling instant for processing by other circuitry, in response to a track signal that alternates with a hold signal, wherein the track-and-hold circuit includes: a bi-directional current source that sources and sinks current through a first output node and a second output node, wherein the bi-directional current source includes: a first NPN transistor that is adapted to receive a track signal at its base and that is coupled to the first output node at its collector; a second NPN transistor that is coupled to the emitter of the first NPN transistor at its emitter, that is coupled to the second output node at its collector, and that is adapted to receive the hold signal at its base; a first PNP transistor that is coupled to the first output node at its collector and that is adapted to receive the track signal at its base; a second PNP transistor that is coupled to the second output node at its collector, that is coupled to the emitter of the first PNP transistor at its emitter, and that is adapted to receive the hold signal at its base; an RC network that is coupled to one of the node between the collectors of the first and second PNP transistors and the node between the collectors of the first and second NPN transistors, wherein the RC network receives the analog input signal and is scaled to change the location of a zero to reduce the signal-dependence of the sampling instant; a unity gain amplifier including: a third NPN transistor that is coupled to the first output node at its emitter and that receives the analog input signal at its base; a third PNP transistor that is coupled to the first output node at its base; a fourth PNP transistor that is coupled to the second output node at its emitter and that receives the analog input signal at its base; a fourth NPN transistor that is coupled to the second output node at its base; a resistor coupled to the emitters of the third PNP transistor and the fourth NPN transistor; and a capacitor coupled between the resistor and ground; and a quantizer adapted to convert the values of the sampled voltage to a digital signal.

In accordance with a preferred embodiment of the present invention, the RC network further comprises a second resistor and a second capacitor, wherein the second resistor and the second capacitor are about equal to resistor and capacitor, respectively.

In accordance with a preferred embodiment of the present invention, the bi-directional current source further comprises a second RC network that is coupled to the other of the node between the collectors of the first and second PNP transistors and the node between the collectors of the first and second NPN transistors, wherein the second RC network receives the analog input signal and is scaled to change the location of a zero to reduce the signal-dependence of the sampling instant.

In accordance with a preferred embodiment of the present invention, the RC network further comprises a second resistor and a second capacitor coupled in series with one another and wherein the second RC network further comprises a third resistor and a third capacitor coupled in series with one another, and wherein the combined resistance of second and third resistors and the combined capacitances of the second and third capacitors are about equal to resistance of the resistor and the capacitance of the capacitor, respectively.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
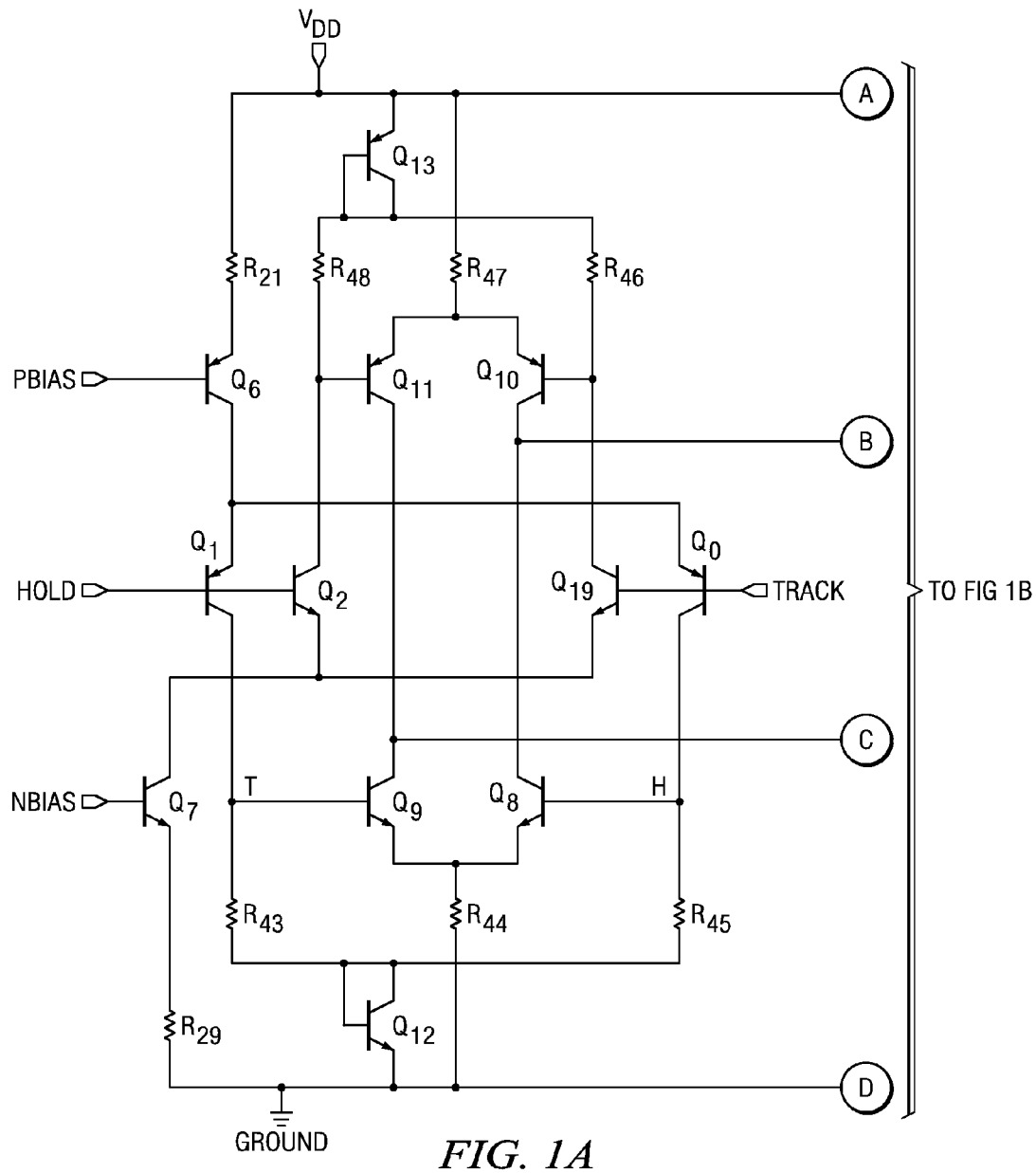
FIG. 1A is a circuit diagram of a first portion of an example prior art sample-and hold circuit.

Refer now to the drawings wherein depicted elements are, for the sake of clarity, not necessarily shown to scale and wherein like or similar elements are designated by the same reference numeral through the several views.

Figure 1B:
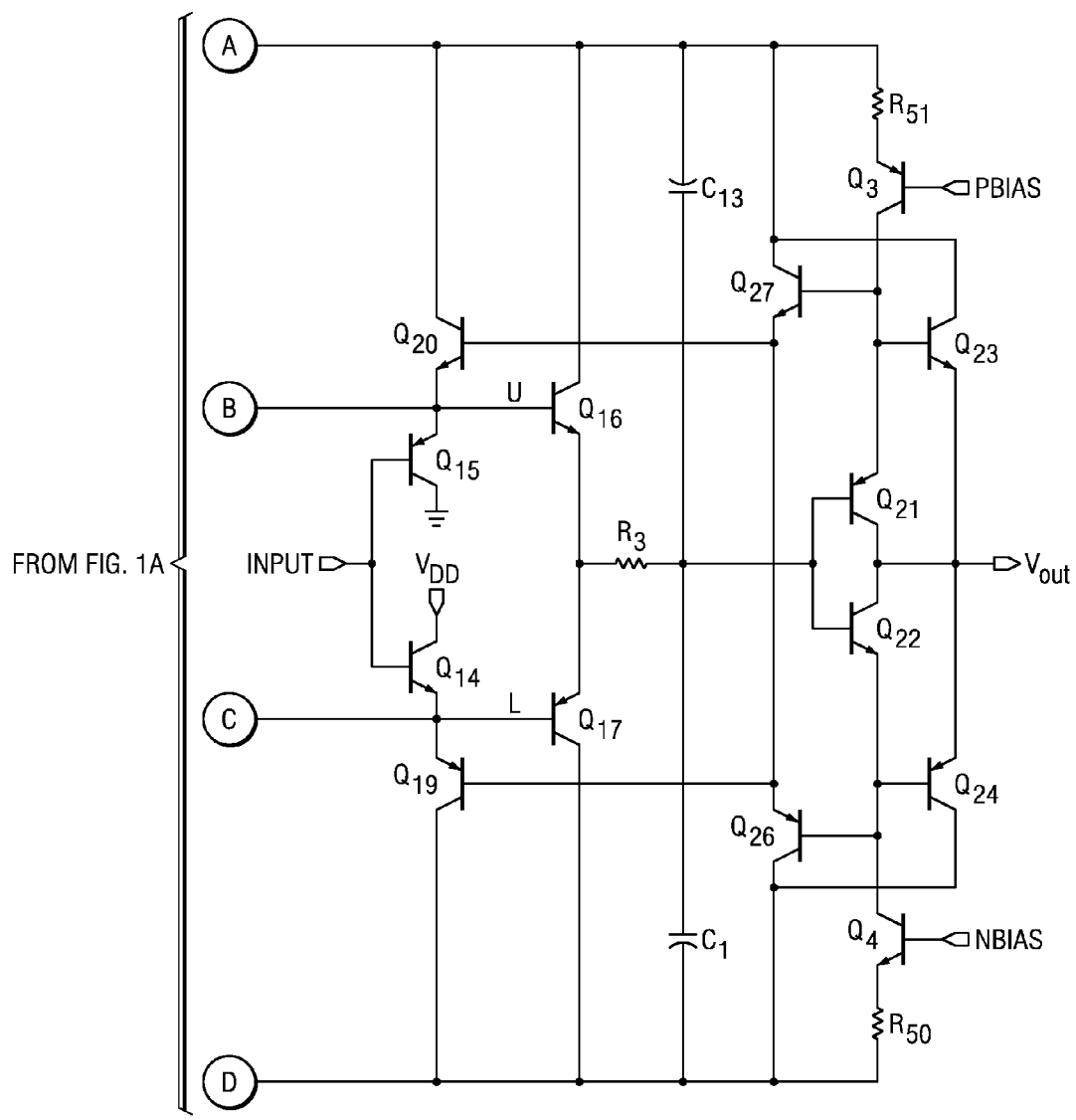
FIG. 1B is a circuit diagram of a second portion of the example prior art sample-and-hold circuit of FIG. 1A.

FIGS. 1A and 1B show a circuit diagram of an exemplary prior art sample-and hold circuit. The circuit is powered by a power supply providing a source voltage VDD at a VDD node, and a current return ground at a GROUND node. Referring to FIG. 1A, a PNP bipolar transistor Q6 has its emitter connected to VDD through a resistor R21, receiving a bias voltage from node PBIAS at its base. The collector of transistor Q6 is connected to the emitter of a PNP bipolar transistor Q1 and to the emitter of a PNP bipolar transistor Q0. A diode-connected PNP bipolar transistor Q13 has its emitter connected to VDD, and its base and collector connected to one terminal of a resistor R46 and to one terminal of a resistor R48. The other end of resistor R48 is connected to the base of a PNP bipolar transistor Q11 and to the collector of an NPN bipolar transistor Q2. The other end of resistor R46 is connected to the base of a PNP bipolar transistor Q10 and to the collector of an NPN bipolar transistor Q19. The emitters of transistors Q10 and Q11 are connected to VDD through a resistor R47. The collector of transistor Q11 is connected to the collector of an NPN bipolar transistor Q9, and to a connection identified as "C" to the circuitry shown in FIG. 1B. The collector of transistor Q10 is connected to the collector of an NPN bipolar transistor Q8, and to a connection identified as "B" to the circuitry shown in FIG. 1B.

An NPN bipolar transistor Q7 has its emitter connected to GROUND through a resistor R29, receiving a bias voltage from node NBIAS at its base. The collector of transistor Q7 is connected to the emitter of transistor Q2 and to the emitter of transistor Q19. A diode-connected NPN bipolar transistor Q12 has its emitter connected to GROUND, and its base and collector connected to one terminal of a resistor R43 and to one terminal of a resistor R45. The other end of resistor R43 is connected to the base of transistor Q9 and to the collector of transistor Q1. The other end of resistor R45 is connected to the base of transistor Q8 and to the collector of transistor Q0. The emitters of transistors Q8 and Q9 are connected to GROUND through a resistor R44. The base of transistor Q1 and the base of transistor Q2 are connected together and to a HOLD node receiving a HOLD signal. The base of transistor Q0 and the base of transistor Q19 are connected together and to a TRACK node receiving a TRACK signal. The power supply node VDD connects to the circuitry of FIG. 1B by way of a connection identified as "A", while the GROUND node connects to the circuitry of FIG. 1B by way of a connection identified as "D".

Referring to FIG. 1B, the collector of an NPN bipolar transistor Q20 is connected to VDD, as is the collector of an NPN bipolar transistor Q16. The emitter of transistor Q20 is connected to the emitter of a PNP bipolar transistor Q15, which has its collector connected to GROUND. The collector of a PNP bipolar transistor Q19 is connected to GROUND, as is the collector of a PNP bipolar transistor Q17. The emitter of transistor Q19 is connected to the emitter of an NPN bipolar transistor Q14, which has its collector connected to VDD. The base of transistor Q14 and the base of transistor Q15 are both connected together and to an INPUT node to which an INPUT signal is applied, which is an analog input signal to be digitized.

The base of transistor Q16 is connected to receive connection "B" from the circuitry of FIG. 1A, while the base of transistor Q17 is connected to receive connection "C" from the circuitry of FIG. 1A. The emitters of transistors Q16 and Q17 are connected together and to a terminal of a resistor R3. The other terminal of resistor R3 is connected to the common connection node of terminals of a capacitor C1 and a capacitor C13. The other terminal of capacitor C1 is connected to GROUND, while the other terminal of capacitor C13 is connected to VDD. The common connection node of resistor R3 and capacitors C1 and C13 is connected to the common connection node of the base of a PNP bipolar transistor Q21 and the base of an NPN bipolar transistor Q22. The emitter of transistor Q21 is connected to the base of an NPN bipolar transistor Q27 and to the base of an NPN bipolar transistor Q23, and to the collector of a PNP transistor Q3. The base of transistor Q3 is connected to PBIAS, while its emitter is connected to VDD through a resistor R51. The emitter of transistor Q27 is connected to the base of transistor Q20, to the base of transistor Q19 and to the emitter of a PNP transistor Q26. The collector of transistor Q27 is connected to VDD and to the collector of transistor Q23. The emitter of transistor Q22 is connected to the base of a PNP bipolar transistor Q26 and to the base of a PNP bipolar transistor Q24, and to the collector of an NPN transistor Q4. The base of transistor Q4 is connected to NBIAS, while its emitter is connected to VDD through a resistor R50. The collector of transistor Q26 is connected to GROUND and to the collector of transistor Q24. The emitters of transistors Q23 and Q24 are connected together and to the collectors of transistors Q21 and Q22, the common connection of all of which forming the output node VOUT.

Referring now back to FIG. 1A, in operation, transistor Q6, which is set using the value of PBIAS, functions as a current source, and gets switched to either resistor R43 or resistor R45, depending on the state of signals TRACK and HOLD. Transistor Q7, which is set using the value of NBIAS, functions as a current sink, operating in complementary operation to the current sourcing of transistor Q6. Transistors Q8, Q9, Q10 and Q11 operate in cooperation with transistors Q6 and Q7 to establish a simultaneous current source through connection "B" and current sink through connection "C", or, alternatively, a simultaneous current source through connection "C" and current sink through connection "B".

Thus, during the tracking phase, when the signal TRACK is high, turning transistor Q0 off and transistor Q1 on, the current from transistor Q6 is switched to resistor R43, thus establishing a voltage at node T. This voltage sets up a corresponding current sinking through transistor Q9, and thus through connection "C", while at the same time a current sourcing is set up though transistor Q10, and thus through connection "B", since the high TRACK signal turns on transistor Q19, and, consequently, also turns on transistor Q10.

During the holding phase, when the signal HOLD is high, the reverse occurs. That is, the high HOLD signal turns transistor Q1 off and transistor Q0 on, switching the current from transistor Q6 to resistor R45, thus establishing a voltage at node H. This voltage sets up a corresponding current sinking through transistor Q8, and thus through connection "B", while at the same time a current sourcing is set up though transistor Q11, and thus through connection "C", since the high HOLD signal turns on transistor Q2, and, consequently, also turns on transistor Q11. In general, the circuitry shown in FIG. 1A functions as a current switch, switching current sinking and sourcing between connections "B" and "C" in response to the state of the TRACK and HOLD signals. Also in general, a typical track-and-hold circuit will have some circuitry that has a switching function, in response to the state of the TRACK and HOLD signals, for the signal holding circuitry, which in this embodiment is shown in FIG. 1B.

Referring now back to FIG. 1B, and continuing to describe the operation of the circuit of FIGS. 1A and 1B, during the tracking phase current is sourced on connection "B" and sunk on connection "C", thus turning on transistors Q16 and Q17. Now, transistors Q14, Q15, Q16 and Q17, together form a unity gain amplifier, with the current sourced/sunk via connections "B" and "C", transistors Q19 and Q20 are off. During this tracking phase, the analog INPUT signal is basically buffered in the unity gain amplifier and, since transistors Q16 and Q17 are on, the buffered voltage is transferred to the plates of capacitors C1 and C13 through resistor R3.

During the holding phase current is sourced on connection "C" and sunk on connection "B", thus turning off the unity gain amplifier, as well as transistors Q16 and Q17. These currents flow through transistors Q20 and Q19. Q19 and Q20 act to limit the voltage on the nodes U and L in such a way that the resulting reverse bias of Q16$s$ and Q17$s$ base emitter junction is independent of the incoming signal at the "Input". This helps to preserve the voltage across capacitors C1 and C13 at the time of transition from tracking phase to holding phase. This voltage is buffered in a unity gain output amplifier formed by transistors Q21, Q22, Q23 Q24, Q26 and Q27, and resistors R50 and R51, and provided as an output voltage VOUT to the output node VOUT.

A problem with the sample-and-hold circuit of FIGS. 1A and 1B arises from the use of resistor R3. This resistor is provided in the circuit to limit the noise bandwidth of the unity gain amplifier described above. The transistors of that amplifier, transistors Q14, Q15, Q16 and Q17, have wide bandwidths, and thus are a source of considerable noise. This noise is integrated over the period of the tracking phase by capacitors C1 and C13, and is therefore a significant source of error. Resistor R3 limits the noise bandwidth and thus reduces this error.

Figure 4:
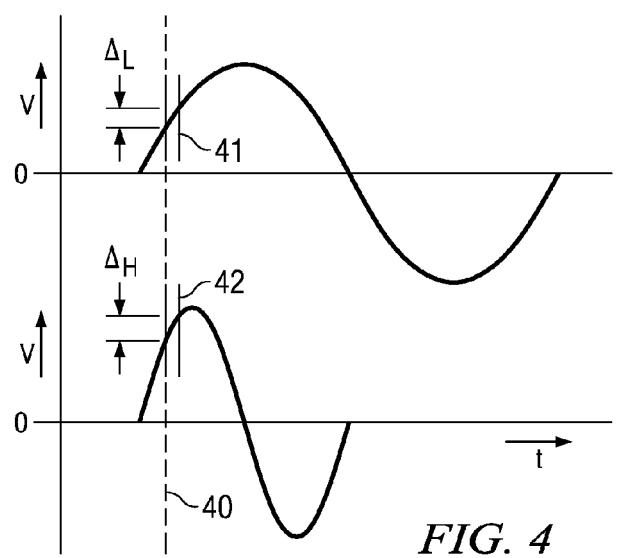
FIG. 4 is a graph of two input signals, showing a sampling instant.

However, resistor R3 introduces another problem. It limits how quickly transistors Q16 and Q17 turn off. This, in turn, produces a signal-dependent sampling instant, which has the effect of introducing an error, namely, harmonic distortion with increasing input frequency. This can be better understood by referring to FIG. 4, which shows two graphs of voltage versus time, time aligned in the figure, one above the other. The top graph shows a plot of one cycle of a low frequency INPUT signal, while the bottom graph shows a plot of one cycle of an INPUT signal having a higher frequency than that of the signal in the top graph. The vertical dashed line 40 represents an instant in time at the transition between a tracking phase and a holding phase. A small vertical line 41 intersects the plot of the low frequency INPUT signal a period of time after the time depicted by the dashed line 40, the period representing the time it takes the transistors Q16 and Q17 of FIG. 1B to turn off. During such period the transistors Q16 and Q17 will continue to conduct, and thus the voltage on capacitors C1 and C13 continue to follow, to some extent, the continued rise of voltage of the INPUT signal. The additional voltage rise during this period is shown in the figure as $\Delta_L$.

A small vertical line 42 intersects the plot of the higher frequency INPUT signal the same period of time after the time depicted by dashed line 40 as in the top graph. Since the frequency is higher than that of the signal in the top graph, the voltage rise during this period is greater, as shown in the graph as $\Delta_H$.

Thus it will be appreciated that this additional voltage component that appears, at least to some extent, on capacitors C1 and C13, has a magnitude that is frequency dependent. This manifests itself in the output signal as harmonic distortion that increases with increasing frequency.

Figure 2:
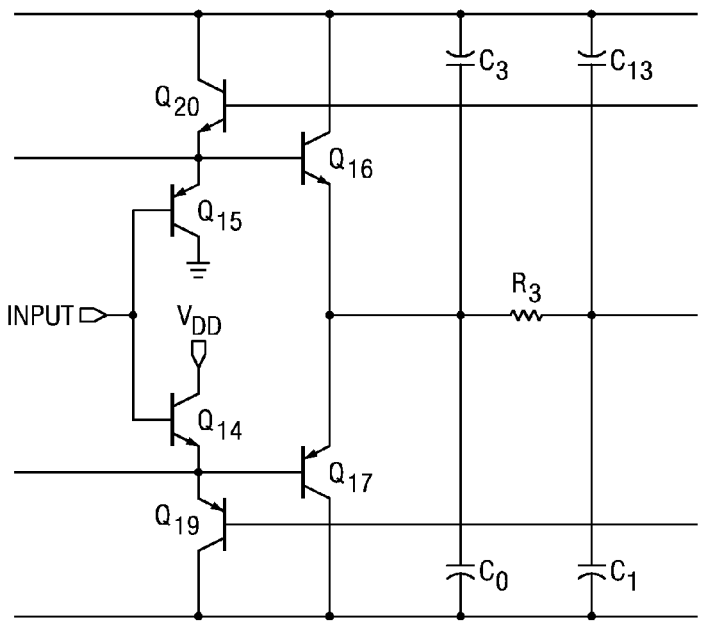
FIG. 2 is a circuit diagram of a preferred embodiment of the present invention.

FIG. 2 is a circuit diagram of a portion of a preferred embodiment of the present invention, corresponding to the unity gain amplifier of FIG. 1B, resistor R3 and capacitors C1 and C13. It can be seen that in the preferred embodiment there are two additional capacitors, capacitors C0 and C3, with capacitor C0 being connected between the connection node of resistor R3 and transistors Q16 and Q17, and GROUND, and capacitor C3 being connected between the connection node of resistor R3 and transistors Q16 and Q17, and VDD. Both capacitor C0 and C3 preferably have a capacitance that is in the range of 10% to 20% of the capacitance of capacitors C1 and C13, although the invention contemplates capacitances outside that range for capacitors C0 and C3.

These additional capacitances provide a relatively low impedance path to help in the discharge of charge in transistors Q16 and Q17 as they turn off, thus significantly shortening the time it takes for them to turn off. By careful selection of the magnitude of their capacitance values, these additional capacitors can be made to have a negligible effect on the noise bandwidth of the unity gain amplifier during the tracking phase.

Figure 3:
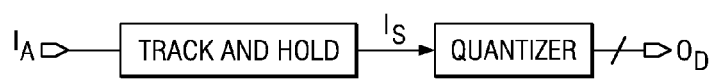
FIG. 3 is a block diagram of the architecture of an ADC.
Figure 5:
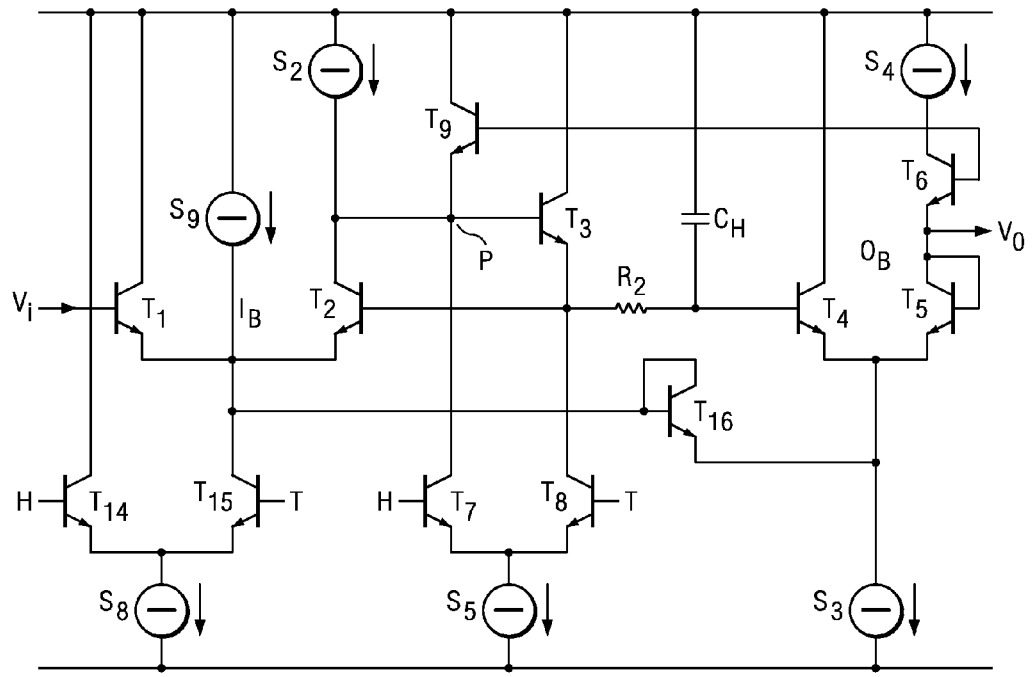
FIG. 5 is an example of a prior art sample-and-hold circuit.
Figure 6:
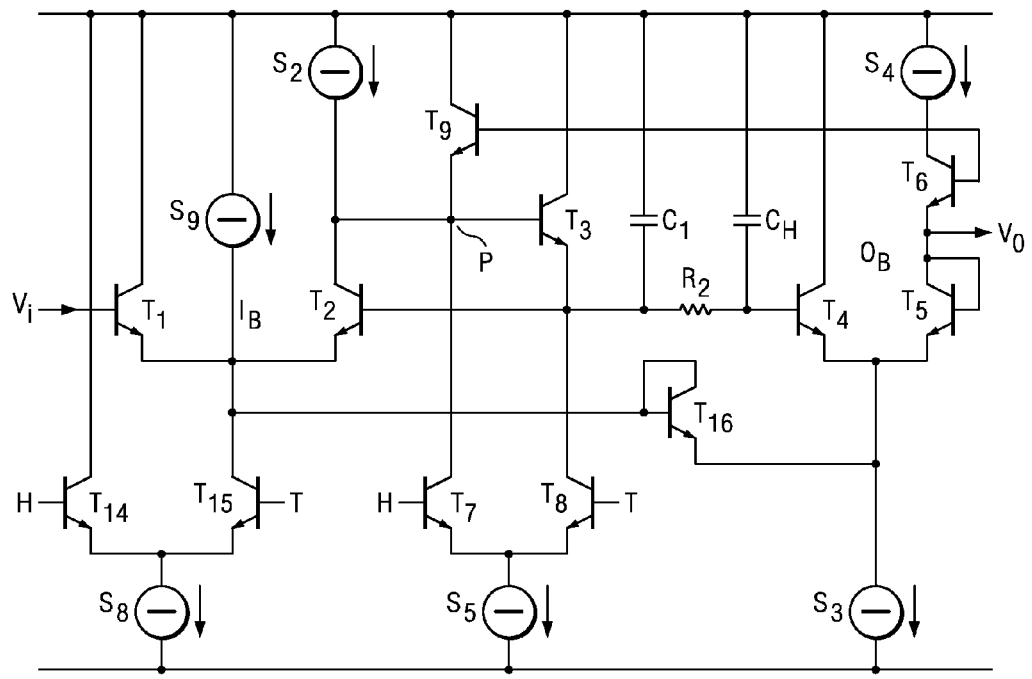
FIG. 6 is a circuit diagram of a preferred embodiment of the present invention.
Figure 7A:
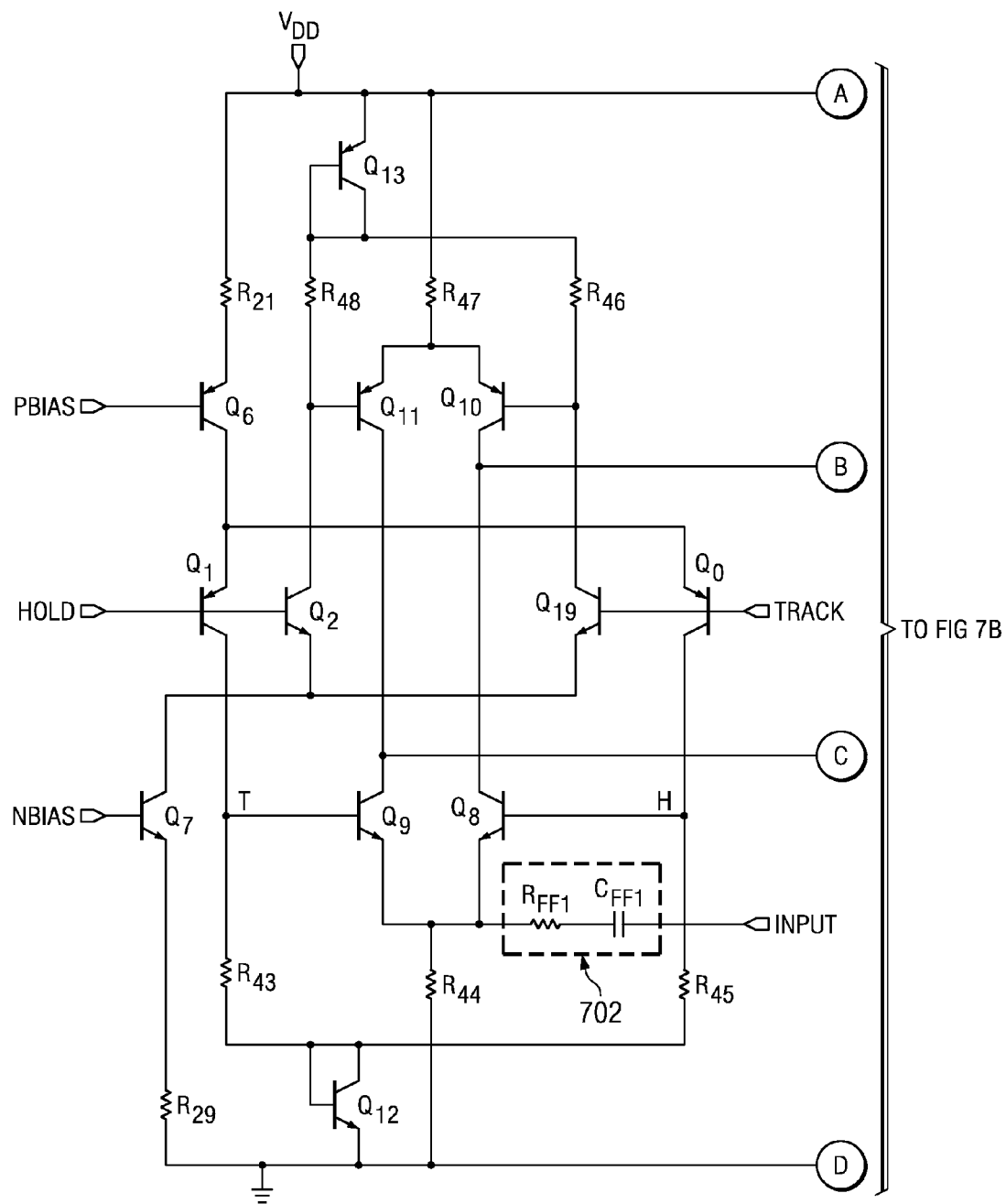
FIG. 7A is a first portion of a circuit diagram in accordance with a preferred embodiment of the present invention.
Figure 7B:
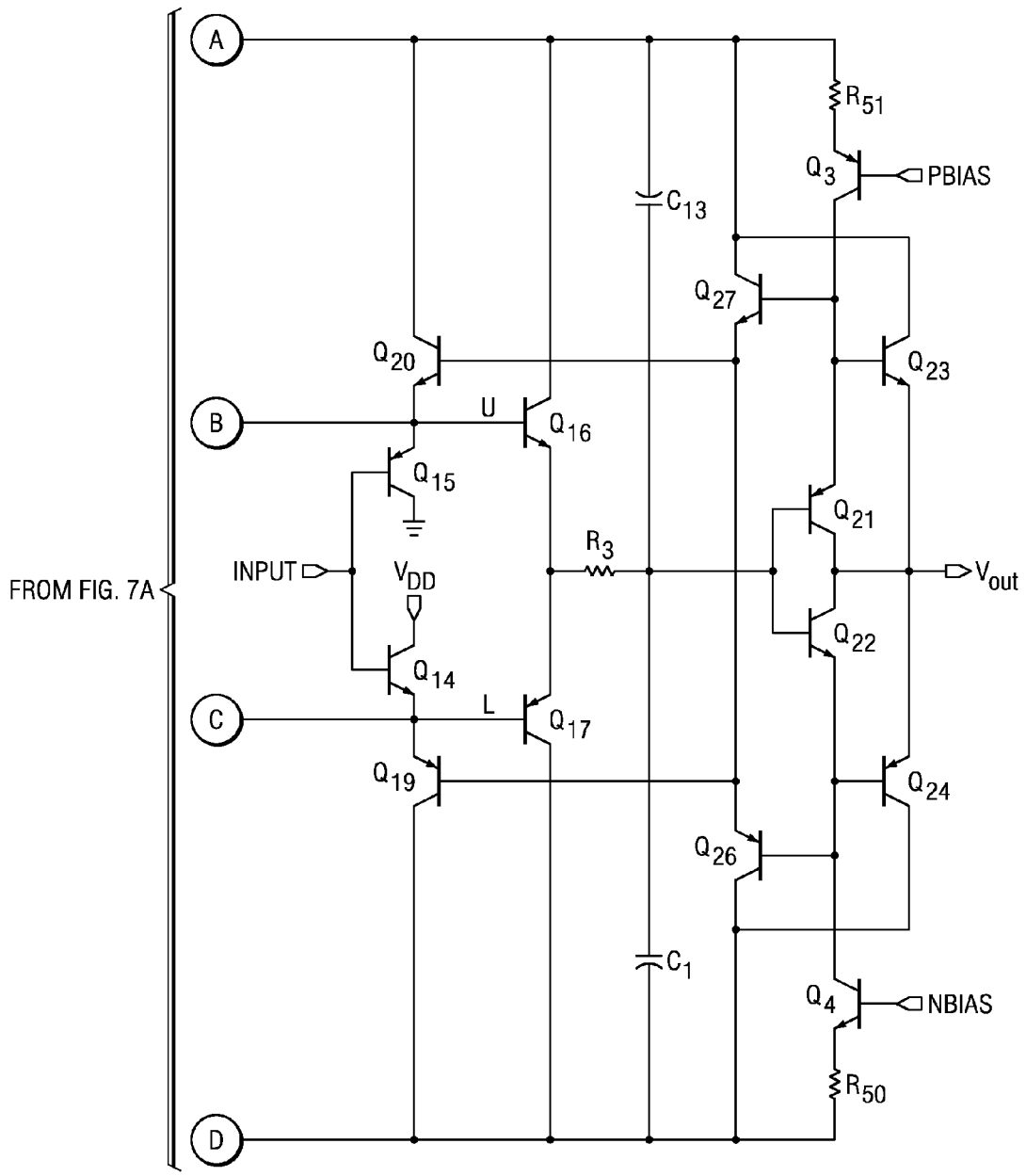
FIG. 7B is a second portion of a circuit diagram of FIG. 7A.
Figure 8A:
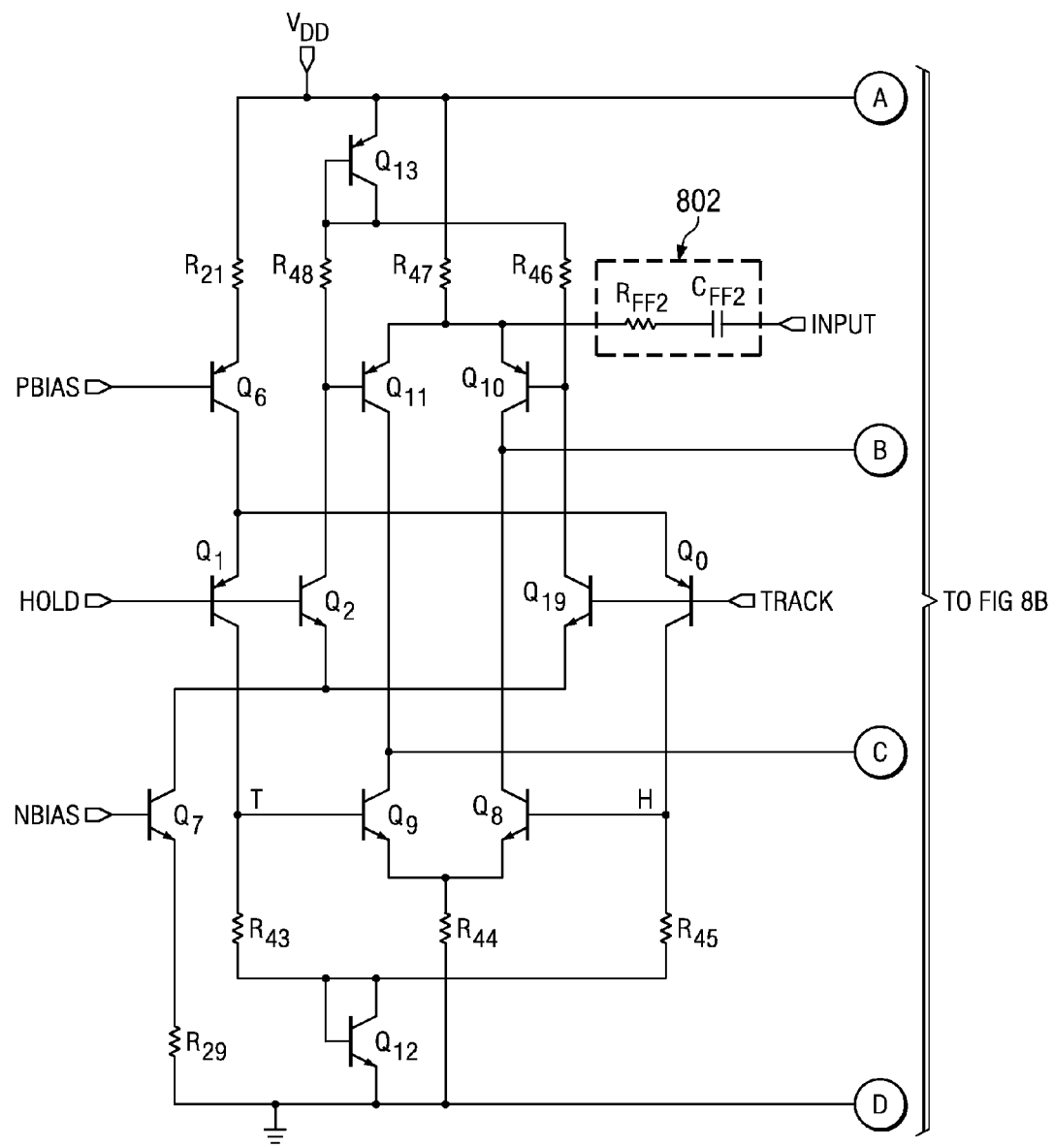
FIG. 8A is a first portion of a circuit diagram in accordance with a preferred embodiment of the present invention.
Figure 8B:
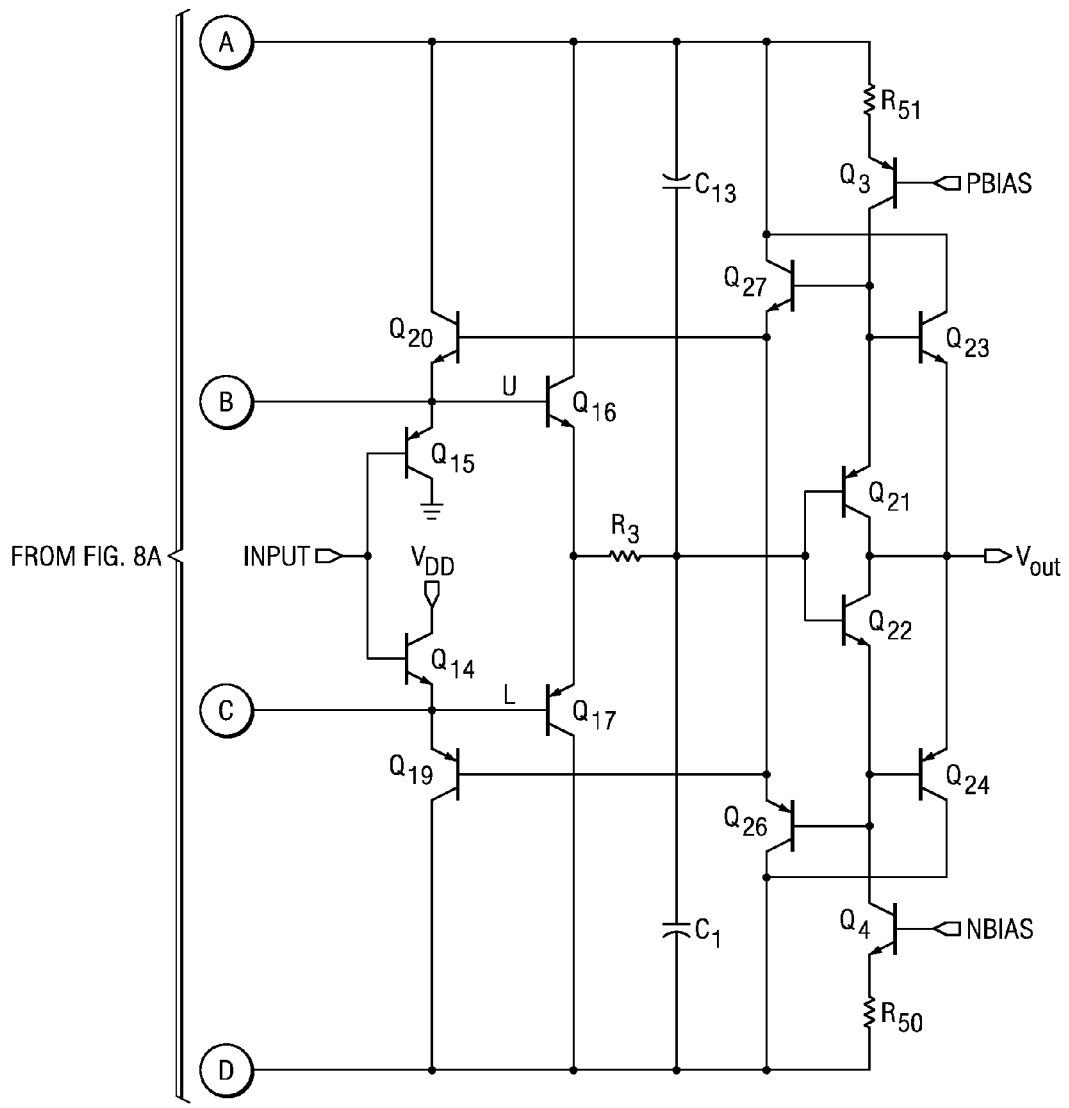
FIG. 8B is a second portion of a circuit diagram of FIG. 8A.

The invention is applicable to numerous track-and-hold circuit architectures. For example, FIG. 5 is the same as FIG. 3 of the aforementioned U.S. Pat. No. 6,489,814, while FIG. 6 shows the same circuit as that of FIG. 5, but having an additional capacitor $C_I$ added in accordance with the present invention.

Figure 9A:
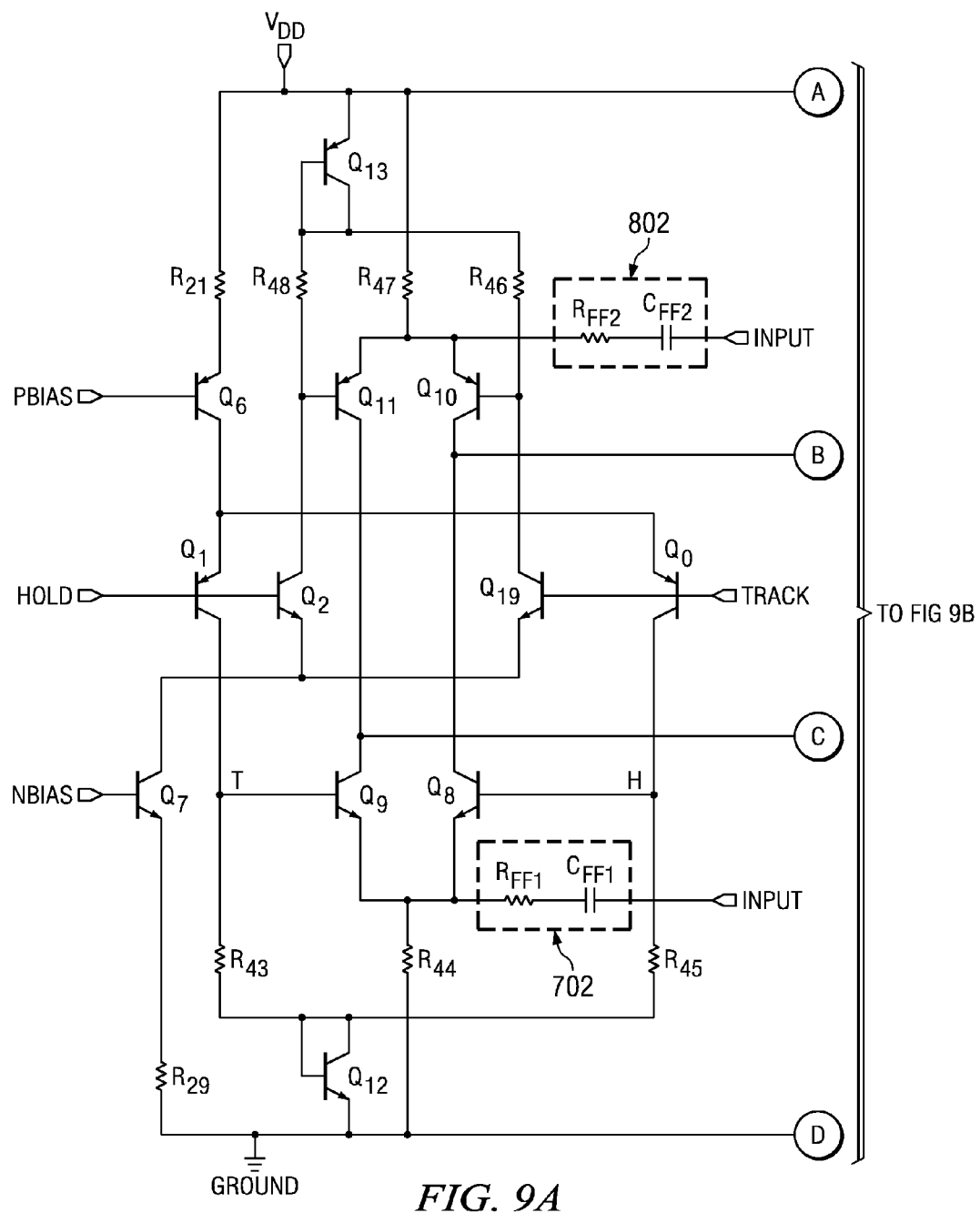
FIG. 9A is a first portion of a circuit diagram in accordance with a preferred embodiment of the present invention.
Figure 9B:
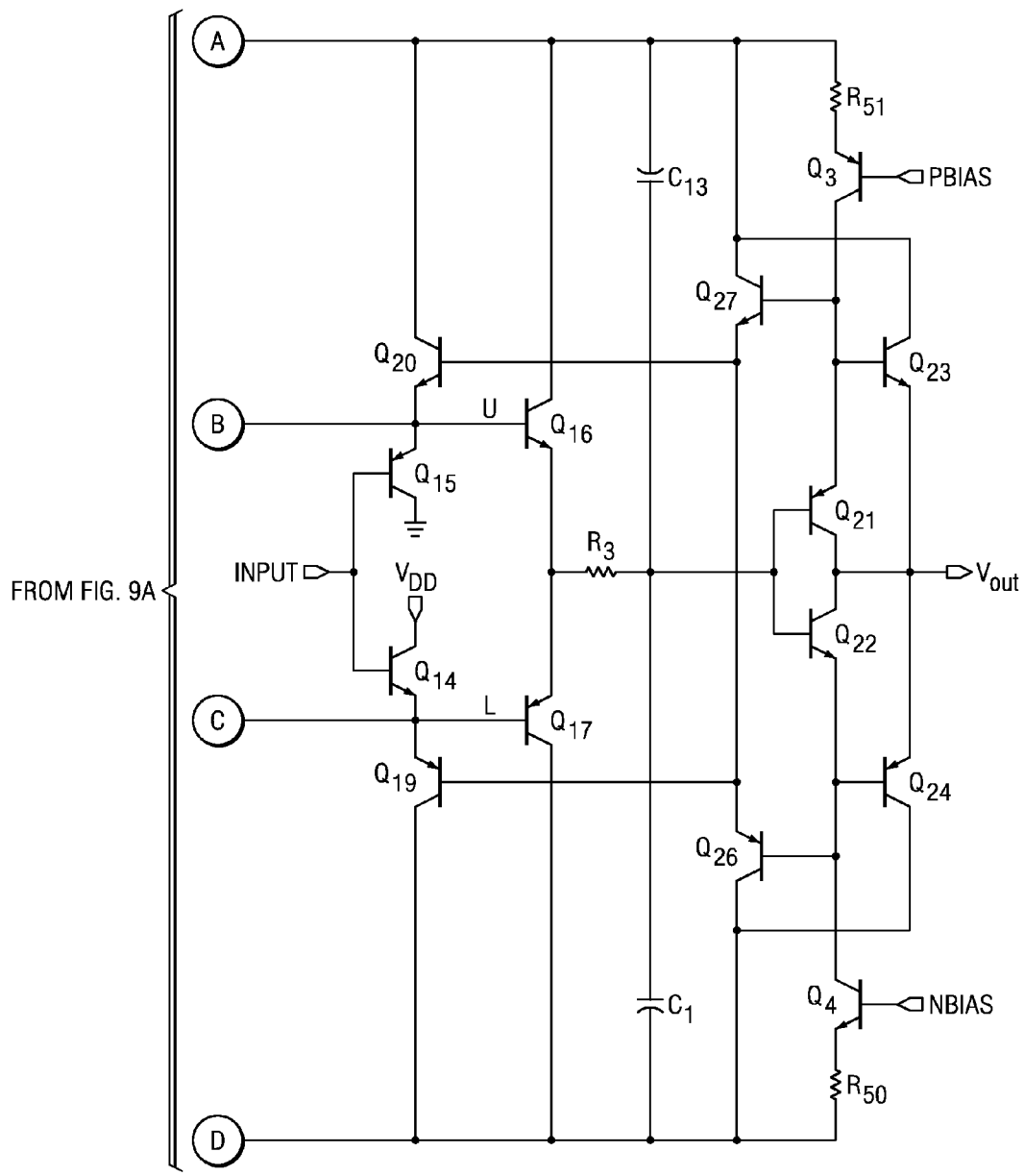
FIG. 9B is a second portion of a circuit diagram of FIG. 9A.

As stated above, the circuit of FIGS. 1A and 1B have a signal-dependent sampling instant, which has the effect of introducing an error, namely, harmonic distortion with increasing input frequency. Turning to FIGS. 7A through 9B, the track-and hold circuit of FIGS. 1A and 1B are shown with additional feed-forward RC networks, which can reduce the signal-dependence of the sampling instant. To accomplish this, RC networks 702 and 802 are coupled to the emitters of NPN transistors Q8 and Q9 and the emitters of PNP transistors Q10 and Q11 (respectively) of the bi-directional current sources of FIGS. 7A, 8A, and 9A, and each RC network 702 and 802 receives the analog input signal to feed-forward a signal into bi-directional current source. RC network 702 is generally comprised of resistor RFF1 and capacitor CFF1, and RC network 802 is generally comprised of resistor RFF2 and CFF2. Each of these resistors RFF1 and RFF1 and capacitors CFF1 and CFF2 are selected or scaled to change the location of a zero of the transfer function to reduce the signal-dependence of the sampling instant. Additionally or alternatively, a track-and-hold circuit may include one (as shown in FIGS. 7A through 8B) or both (as shown in FIGS. 9A and 9B) of the RC networks 702 and 802.

As an example, RC networks 702 and 802 (individually or collectively) are generally the same order of magnitude as the RC sampling network. For example, with the circuit of FIGS. 9A and 9B, the total capacitance of the RC networks 702 and 802 (i.e., CFF1+CFF2) is about the same as the capacitance of capacitor C1, and the resistance (i.e., (RFF1+RFF2)/2) is about the same as resistance of resistor R3. The values of these resistors RFF1 and RFF2 and capacitors CFF1 and CFF2 can be adjusted to obtain a desired performance since the cancellation effect generally cannot be predicted with certainty due to inherent variances between transistors. Through simulation, though, the values of these resistors RFF1 and RFF2 and capacitors CFF1 and CFF2 can be estimated since these components also compensate for parasitic components that are present in live implementations.

Figure 10:
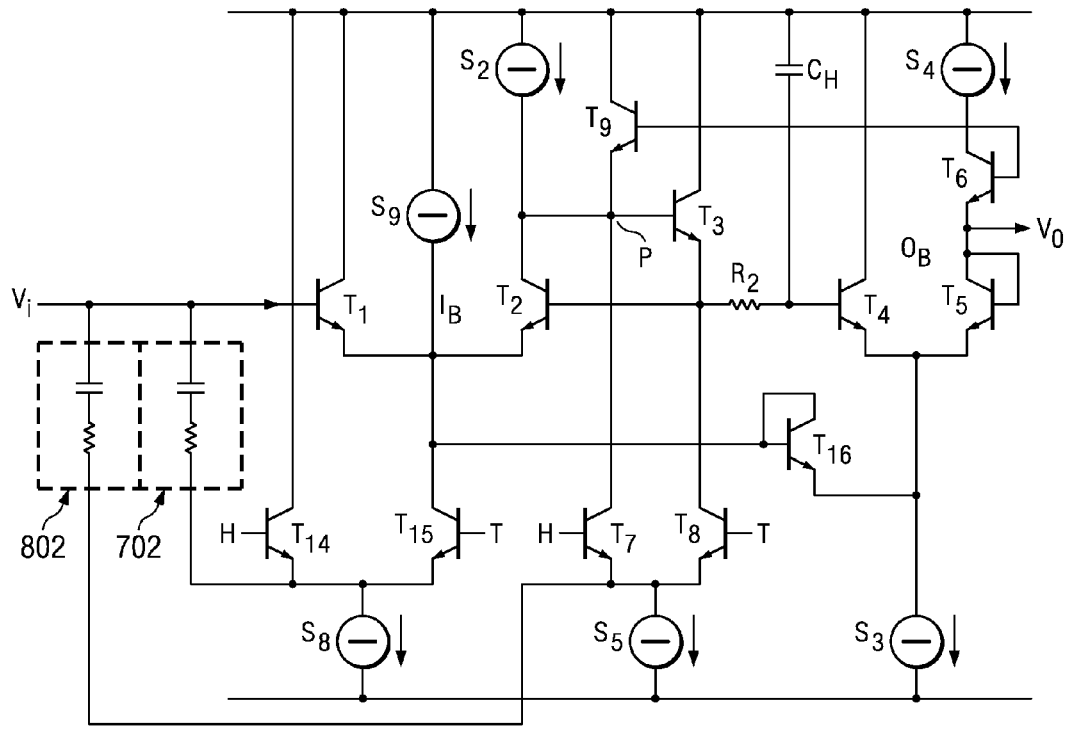
FIG. 10 is a circuit diagram of a preferred embodiment of the present invention.

The RC networks 702 and 802 may also be applicable to numerous track-and-hold circuit architectures. For example, FIG. 10 shows the same circuit as that of FIG. 5, but having RC networks 702 and 802 added in accordance with the present invention.

Figure 11:
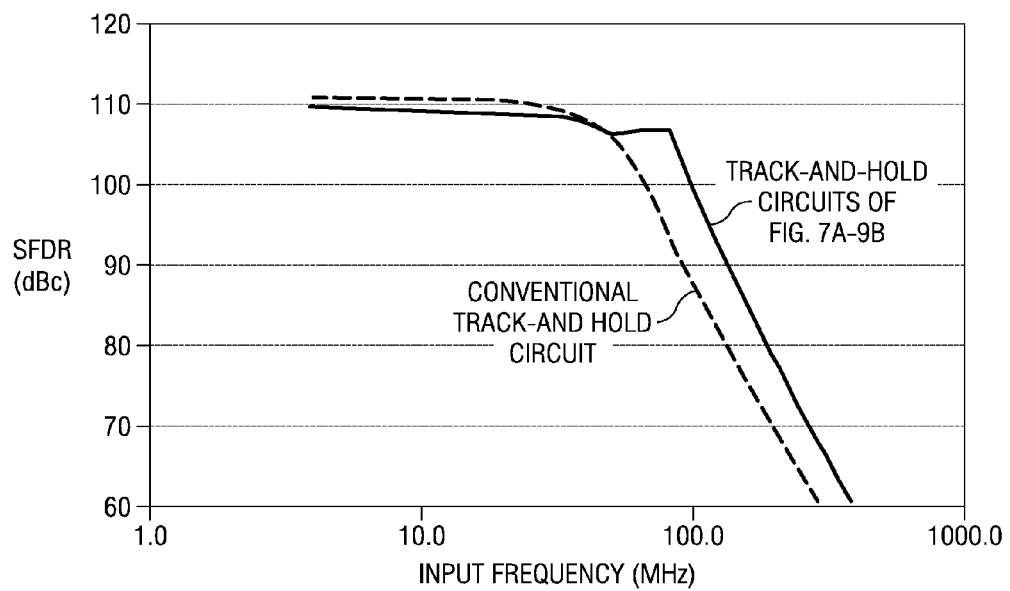
FIG. 11 is a graph depicting the Spurious-Free Dynamic Range (SFDR) versus frequency of an ADC that employs a convention sample-and-hold circuit and an ADC employing a sample-and-hold circuit of FIGS. 6-9.

As a result of the use of these RC networks 702 and/or 802, the performance of an ADC can be dramatically increased. As can be seen in FIG. 11, a graph depicting the SFDR versus frequency of a conventional ADC and an ADC employing RC networks 702 and/or 802 is shown. Clearly, the frequency range is dramatically increased; essentially, the inclusion of RC networks 702 and/or 802 can create a 10-fold increase in performance, making ADC's employing RC networks 702 and/or 802 highly desirable.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A track-and-hold circuit that is configured to track an analog input signal and hold a sampled voltage of the analog input signal at a sampling instant for processing by other circuitry, in response to a track signal that alternates with a hold signal, the track-and-hold circuit comprising:

a bi-directional current source that is configured to source and sink current through a first output node and a second output node, wherein the bi-directional current source includes:
  a differential input circuit that is configured to receive the track signal and the hold signal and that is coupled to the first and second output nodes; and
  a feed-forward network that is coupled to the differential input circuit, wherein the feed-forward network is configured to receives the analog input signal and is configured to change the location of a zero to reduce the signal-dependence of the sampling instant;
a unity gain amplifier that is coupled to first and second output nodes of the bi-directional current source and that is configured to receives the analog input signal;
a resistor coupled to an output of the unity gain amplifier; and
a capacitor coupled between the resistor and ground.

2. The track-and-hold circuit of claim 1, wherein the bi-directional current source further comprises a second differential input circuit that is configured to receive the track signal and the hold signal and that is coupled to the first and second output nodes.

3. The track-and-hold circuit of claim 1, wherein the track-and-hold circuit further comprises a unity gain buffer that is coupled to the resistor and the capacitor.

4. An analog-to-digital converter (ADC) comprising:
  a track-and-hold circuit that is adapted to track an analog input signal and hold a sampled voltage of the analog input signal at a sampling instant for processing by other circuitry, in response to a track signal that alternates with a hold signal, the track-and-hold circuit comprising:
    a bi-directional current source that is configured to source and sink current through a first output node and a second output node, wherein the bi-directional current source includes:
      a differential input circuit that is configured to receive the track signal and the hold signal and that is coupled to the first and second output nodes; and
      a feed-forward network that is coupled to the differential input circuit, wherein the feed-forward network is configured to receives the analog input signal and is configured to change the location of a zero to reduce the signal-dependence of the sampling instant;
    a unity gain amplifier that is coupled to first and second output nodes of the bi-directional current source and that is configured to receives the analog input signal;
    a resistor coupled to an output of the unity gain amplifier; and
    a capacitor coupled between the resistor and ground; and
  a quantizer that is coupled to the track-and-hold circuit.

5. The ADC of claim 4, wherein the bi-directional current source further comprises a second differential input circuit that is configured to receive the track signal and the hold signal and that is coupled to the first and second output nodes.

6. The ADC of claim 4, wherein the track-and-hold circuit further comprises a unity gain buffer that is coupled to the resistor and the capacitor.

* * * * *